United States Patent [19]

Michaels et al.

[11] 4,366,469
[45] Dec. 28, 1982

[54] COMPANDING ANALOG TO DIGITAL CONVERTER

[75] Inventors: Stuart R. Michaels, Commack; Stephen J. Sacks, Woodmere, both of N.Y.

[73] Assignee: ILC Data Device Corporation, Bohemia, N.Y.

[21] Appl. No.: 189,648

[22] Filed: Sep. 22, 1980

[51] Int. Cl.³ ............................................. H03K 13/02
[52] U.S. Cl. ................................. 340/347 AD; 324/115
[58] Field of Search ................. 340/347 AD, 347 M; 324/115, 99 D; 367/65, 66, 67

[56] References Cited

U.S. PATENT DOCUMENTS

| | | | |
|---|---|---|---|
| 3,187,323 | 6/1965 | Flood et al. | 340/347 |
| 3,646,586 | 2/1972 | Kurz | 340/347 |
| 4,114,094 | 9/1978 | Cook | 324/115 |
| 4,129,864 | 12/1978 | Carpenter | 324/115 |
| 4,250,447 | 2/1981 | Lode | 324/115 |

OTHER PUBLICATIONS

Aldridge "Electron" No. 118, Jun. 9, 1977, pp. 52–54.

*Primary Examiner*—C. D. Miller
*Attorney, Agent, or Firm*—Weinstein & Sutton

[57] ABSTRACT

A companding analog to digital converter for converting an analog signal into a variable length multi-bit binary word, the number of said bits being a function of the magnitude of the analog signal being converted relative to the high end of the range of magnitudes capable of being converted. The analog signal is temporarily stored and is attenuated by a predetermined amount. The attenuated signal is converted into a multibit digital word. A group of the most significant bits of said digital word are examined to alter the attenuation of the stored analog signal dependent upon its magnitude relative to the full scale. The attenuated analog signal is again converted into a multi-bit digital word which is temporarily stored. The group of binary bits initially stored together with results of the second conversion operation are combined to develop a multi-bit digital word whose bit length is a function of the magnitude of the stored analog signal relative to scale. Multiplexer means are utilized to transfer stored bits to an output line in order to provide an output word of uniform digital length regardless of the magnitude of the converted analog signal.

7 Claims, 1 Drawing Figure

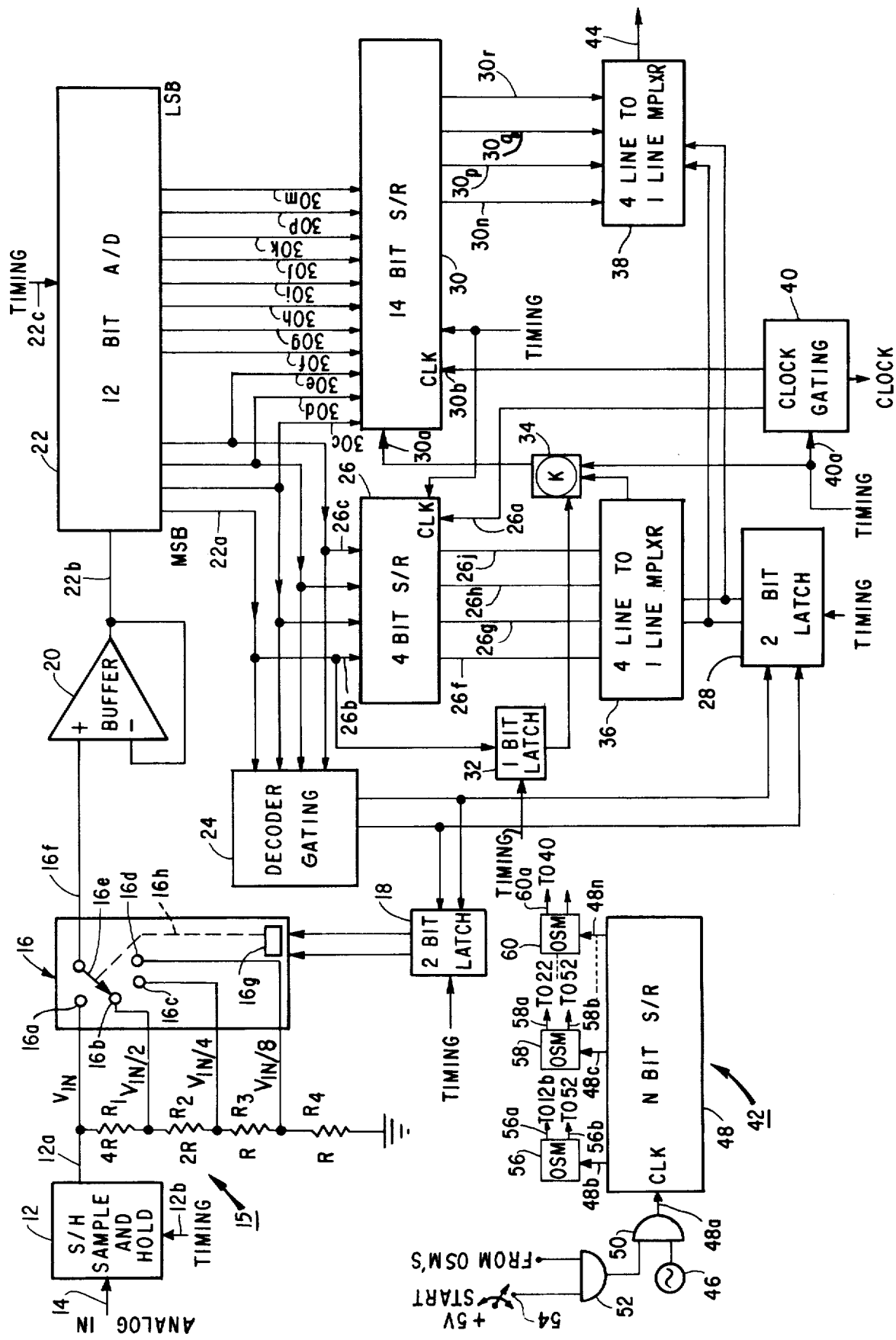

COMPANDING ANALOG TO DIGITAL CONVERTER

FIELD OF THE INVENTION

The present invention relates to analog to digital converters and more particularly to a novel companding analog to digital converter adapted to convert a sample analog signal into a digital word of variable resolution (i.e. bit length) as a function of the magnitude of the sampled analog signal relative to full scale.

BACKGROUND OF THE INVENTION

Analog to digital converters are utilized in a wide variety of applications. Converters of this type employed in frequency division multiplexing applications require that particular attention be given to the signal-to-noise (S/N) ratio. Since the quantization error inherent in analog to digital converters is a source of noise, the S/N ratio is dependent upon the number of bits developed by the analog to digital converter. A digital output of thirteen to fifteen bits is usually required to obtain an acceptable S/N ratio in most telecommunications applications. Although it is possible to construct a standard fifteen bit analog to digital converter utilizing present technology, such a converter is costly to implement due to the very tight constraints which must be placed upon the operation characteristics of the components utilized within the analog to digital converter in order to achieve the necessary linearity an in order to minimize the amount of drift versus time and the amount of drift versus temperature experienced by such an analog to digital converter. Generally the analog to digital converter must be of the successive approximation type due to the high speed conversion requirements. An all parallel (FLASH) analog to digital converter meets the high speed requirement but is generally not used due to its very high complexity and cost.

A two-step conversion approach such as is employed in an analog converter identified by model number ADC16/4 manufactured by the assignee of the present application, utilizes a technique which reduces the constraint of initial accuracy of the components through the use of a programmable read-only memory (PROM) which contains a binary digital word representative of the deviation of the analog to digital converter from the true conversion, which binary digital error word is subtracted from (or added to) the result of the conversion operation to compensate for the deviation of converter output from the true output due to variations in characteristics of the components comprising the A/D converter. Although such a correction method does reduce the constraint of the initial accuracy of said components, this two-step technique does not affect time-temperature requirements and, in addition, is a costly approach to obtain the desired objective.

Since the nature of the signal to be converted in telecommunication applications is noise-like, the average signal is considerably smaller than the full-scale input range of the analog to digital converter. This statement implies that the resolution requirements can be relaxed for large signals, with little deterioration in signal to noise ratio, since the probability of occurrence of large signals is small. As an example, no error is created by an analog to digital converter having a large error for large signals if large signals never occur. Thus, an objective of the present invention to avoid the disadvantages of prior art analog to digital converters by providing an analog to digital converter whose resolution is a function of the magnitude of the analog signal to be converted.

BRIEF DESCRIPTION OF THE INVENTION

The present invention overcomes the disadvantages of prior art analog to digital converters through the utilization of a technique in which an analog to digital converter provides larger resolution for smaller analog signals and smaller resolution for larger signals.

In one preferred embodiment, the converter is operated to provide a fifteen-bit resolution for small signals and a twelve-bit resolution for large signals.

The present invention is characterized by comprising adjustable attenuation means for attentuating a sampled analog signal by an amount which is a fraction of full scale. The attenuated analog signal is converted into a multi-bit binary word by means of an analog to digital converter. The most significant bits are temporarily stored within storage means and are examined by decoder means which inversely readjusts the attentuating circuit in accordance with the relationship between the sampled analog signal and full scale. The sampled analog signal is again converted by the analog to digital converter and the resultant binary word is temporarily stored, whereupon selected ones of the most significant bit group stored as a result of the first analog to digital conversion operation are grouped with the binary word resulting from the second analog to digital conversion to form a resultant multi-bit word whose resolution (i.e. length) is a function of magnitude of the sampled analog signal and, in one preferred embodiment, is comprised of twelve binary bits for large signals and fifteen binary bits for small signals. Multiplexer means and decoder means are used in conjunction with circuitry for storing the binary bit words resulting from the first and second analog to digital conversion operations to regulate word length of the binary word in accordance with the magnitude of the sampled analog signal and are further utilized to serially couple the binary word to an output line when the word coupled to the output line is always of equal bit length regardless of resolution, in order to simplify subsequent data transmission and handling.

Correction logic is also provided to convert unused bits generated during the first data conversion operation to zero level signals which serves to avoid the possibility of introducing a large error when converting very small signals.

Although the invention utilizes a two-step analog to digital conversion process, the design of the present invention necessitates the need for only a single analog to digital converter and avoids the need for a subtracting amplifier or error correcting PROM, as is required in prior art apparatus.

OBJECTS OF THE INVENTION AND BRIEF DESCRIPTION OF THE FIGURES

It is, therefore, one object of the present invention to provide a novel companding analog to digital converter.

Still another object of the present invention is to provide a novel variable resolution analog to digital converter in which greater resolution (i.e. bit length) is provided for small signals and lesser resolution is provided for large signals.

Still another object of the present invention is to provide novel analog to digital converter means utilizing an analog to digital converter, automatically adjustable signal attenuator means and logical gating circuitry utilizing a two-step analog to digital converter process for developing a digital word of variable resolution (i.e. word length) wherein word length is a function of the magnitude of the analog signal.

The above, as well as other objects of the present invention, will become apparent when reading the accompanying description and drawing in which the sole FIGURE is a block diagram showing an analog to digital converter designed in accordance with the principles of the present invention.

DETAILED DESCRIPTION AND BEST MODE FOR CARRYING OUT THE INVENTION

The sole FIGURE shows analog to digital converter means 10 embodying the principles of the present invention and incorporating a sample-and-hold circuit 12 for sampling and holding the analog signal applied at input 14 for a period sufficient to complete the analog to digital conversion. The output 12a is applied to the precision attenuator 16 incorporating a voltage divider circuit comprised of resistors R1 through R4. The resistance value of resistors R3 and R4 is equal to R; the resistance value of R2 is equal to 2R; and the resistance value of R1 is equal to 4R. Attenuator circuit 16 which, although shown in the form of a 4-position rotary switch, may also be in the form of a solid state switch capable of coupling any one of its four inputs 16a to 16d to output line 16f, shown as having a switch arm 16e which may be selectively connected to any of the stationary contacts 16a through 16d by control means 16g, operated under control of signals from a two-bit latch 18. The analog signal is developed across the resistors R1 through R4 and is attenuated at output 16f, by an amount dependent upon the switch position of switch arm 16e wherein the signal is at full value (i.e. is not attenuated) at terminal 16a, half value at 16b, one quarter value at 16c and one eighth value at 16d.

The adjustable precision attenuator circuit 16, under normal operation, is initially set so that switch arm 16e is in the switch position engaging contact 16d applying a signal whose amplitude is one eighth the amplitude of the analog signal stored in sample-and-hold circuit 12. The buffer amplifier 20 applies the signal Vin/8 to a twelve-bit analog to digital converter 22 which is designed to have a full scale range which is one eighth the input full scale range of the composite analog to digital converter 10.

Analog to digital converter 22 is controlled by a timing signal applied at 22c so that it only converts the analog signal into an eight-bit binary code, but with twelve-bit accuracy. One the four most signficant bits of this conversion operation are utilized and are simultaneously coupled to the decoder gating circuitry 24 and latched in a four-bit parallel-in/serial-in/parallel-out shift register 26. The four least significant bits resulting from the analog to digital conversion operation are not utilized, but the additional conversion time for generating these bits is used as a delay. The output of decoder gating circuit 24 is latched into first and second two-bit latches 18 and 28. Latch 18 drives analog multiplexer 16 to select the appropriate tap in the voltage divider circuit 15, control 16g being mechanically coupled to switch arm 16e as represented by dotted line 16h. The tap position selected is dependent upon the output code of twelve-bit analog to digital converter 22, which tap position is determined by the analog input signal to be converted. The coding of control means 16g is set up such that an input which is greater than one half full scale sets the tap to Vin/8; to Vin/4 when greater than one quarter full scale and less than one half full scale; to Vin/2 when greater than one eighth full scale and less than one quarter full scale; and Vin when less one eighth full scale. The coding selects the proper tap of the attenuator circuit 15 in the same manner for negative input signals.

The tap is set immediately after the fourth bit is determined but, since the analog multiplexer circuit 16 and buffer amplifier 20 require time to settle after setting of the tap, analog to digital converter 22 is operated to convert to eight bits to provide adequate time for circuits 16 and 20 to settle.

At the end of this time period, the timing signal applied at 22c of analog to digital converter 22 causes the converter 22 to initiate a new conversion operation. This second conversion is a full twelve-bit length and eleven of the twelve bits are latched into the fourteen bit parallel-in/serial-in/parallel-out shift register 30. The most significant bit of this conversion is applied through line 22a to zero correction logic 34.

At this time, a four-bit word is stored in shift register 26 and an eleven-bit word is stored in shift register 30. However, these two words may not be directly added together due to the nature of the two-step conversion which has taken place.

The first step of the conversion is always performed with the attenuator tap of circuit 16 set to Vin/8. However, the second step of the conversion can be performed at any of the four possible taps. For example, if the input signal is such that the tap 16e engages the Vin contact position 16a, the signal converted during the second conversion step is eight times the magnitude of the signal converted during the first conversion step and the digital code for these eleven bits will be incorrect by a factor of eight. This difference can be accommodated by digitally dividing the code by eight, which may be accomplished in a simple fashion by performing a three-place shift to the right in register 30. Likewise, if attenuator circuit 16 is set so that tap 16e engages a Vin/2 tap position 16b, a two-place shift is required; whereas if arm 16e engages the Vin/4 tap 16c, only a one-place shift is required. It should be noted that no shift is required if switch arm 16e engages the Vin/8 tap position 16d.

The algorithm for constructing the final output code requires that the number of bits from the first four-bit conversion vary. If the first conversion causes attentuator circuit 16 to be set at Vin during the second conversion, then only the most significant bit (MSB) is used. If attenuator circuit 16 is set to Vin/2, the first two bits are used, and so forth for Vin/4 and Vin/8 respectively, in which three bits and four bits are used. If the eleven bit word stored in shift register 30 is tacked on to the variable length first word without previously shifting the second word, then we effectively shift the second word creating a composite output word which can vary from twelve bits to fifteen bits in length, wherein a large magnitude Vin is represented by twelve bits and a small magnitude Vin is represented by fifteen bits, hence the designation "variable resolution analog to digital converter". When it is necessary to provide a serial output of the digital word, as shown in the FIGURE, a varying length word can cause timing problems for the device receiving the word. Thus, it is necessary to "fill out" the word to a constant length by filling the last bits with from none to three binary "1's" or "0's". The logic for implementing this is controlled by the same decoder 24, utilized to set attenuator circuit 16. The decoder data is latched into a two-bit latch 28 and is applied to first and second 4-line to 1-line multiplexers 36 and 38. Multiplexer 36 selects one to four bits as required from shift register 26 while multiplexer 38 selects from none to as many as three zeros from shift register 30. The output of multiplexer 36 is coupled into the serial input 30a of shift register 30 through zero correction circuit 34 which, for the present, may be considered as a direct (i.e. shunt) connection from multiplexer 36 to the input of shift register 30. The data is now set up for transfer and when clock 40, which is coupled to the clock inputs 26a and 30b of shift registers 26 and 30, is enabled, the composite word is shifted from shift register 26 through multiplexer 36, zero correction circuit 34, shift register 30 and multiplexer 38 to output line 44.

The system design 10 is adapted to receive bi-polar input analog signals. As a result, the twelve-bit analog to digital converter 22 is designed to have its most-significant bit (MSB), appearing at output line 22a, to represent the sign bit. This can cause some difficulty for very small signals. If the signal converted is just slightly greater than the offset of the analog to digital converter 22, and is opposite to sign, then the first four bits resulting from the first conversion step will encode the opposite sign from that resulting from the eleven bits generated during the second conversion operation to create a tremendous error (>2000 least significant bits). To avoid this, for all signals less than one-eighth full scale ($\pm$FS/8), the four bits in the first step conversion are not used at all in the output word but are set to one of the two possible codes by the zero correction logic 34, as controlled by the latched MSB from the second twelve-bit conversion. This is actually the bit which is not used in the output word. For all other signal values, logic element 34 simply passes data from multiplexer 36 to shift register 30.

As a result of the design approach described hereinabove, it is possible to replace many costly and critical analog components by a number of inexpensive digital circuits and/or components which contribute only a very minor penalty in performance.

The clock source 40 is enabled by the timing circuit 42 for application of clock pulses to the clock pulse inputs 26a and 30b of shift registers 26 and 30 respectively. The binary states stored in register 26 are shifted from left to right wherein from one to four stages are transferred through multiplexer 36 to input 30a of shift register 30 according to the binary state of the two bits applied to two-bit latch 28. For example, if the binary information in all four stages is transferred to register 30, four-line to one-line multiplexer 36 decodes the data of the two bits in latch 28 causing data to be transferred from only line 26j through multiplexer 36 and zero correction logic circuit 34 to the load input 30a of shift register 30. Four-line to one-line multiplexer 38 operates in a similar manner to transfer the contents of shift register 30 from the four least significant bit positions 30n through 30r. Assuming that only eleven bits are to be shifted from register 30 to output line 44, the state of the two bits in latch 28 controls multiplexer 38 to cause data to be transferred through line 30n only, and multiplexer 38 to output line 44.

All of the circuits within converter 10 are operated in the proper sequence under control of timing circuit 42 which may, for example, comprise a clock source 46 selectively coupled to the clock input 48a of a multistage shift register 48 by gate 50. A conversion operation is initiated by closure of switch 54, for example, which condition is passed by OR-gate 52 to the remaining input of gate 50 to pass a pulse from clock source 46 through gate 50 to the clock input of register 48. The first stage of register 48 is enabled, causing a one-shot multivibrator 56 to be triggered. Input 56a of one-shot multivibrator 56 is utilized to enable sample-and-hold circuit 12 at the end of a suitable time delay, obtained by the appropriate line of one-shot multivibrator 56, the output states of one-shot multivibrator 56 are reversed causing the sampling signal applied to sample-and-hold circuit 12 to be removed. Output 56b is coupled to gate 52, allowing the next pulse from clock source 46 to be passed by gate 50 to advance shift register 48 to the next stage. A similar one-shot multivibrator, for example multivibrator 58, is triggered by output 48c of the next shift register stage causing its output 58e to trigger the operation of analog to digital converter 22, at control input 22c. The output states of outputs 58a and 58b of one-shot multivibrator 58 reverse, causing the timing signal to be removed from analog to digital converter 22 and causing an enable signal to be passed through gate 52 to enable the next pulse from clock source 56 to be passed to the clock input of shift register 48, initiating the next operation in proper sequence. The final operation, namely the transfer of the contents of registers 26 and 30 to output line 44, is initiated when the output 48n of the Nth stage of register 48 enables one-shot multivibrator 60 causing its output 60a to enable gating clock 40 for a period sufficient to transfer a fifteen-bit binary word to output line 44.

A latitude of modification, change and substitution is intended in the foregoing disclosure and in some instances, some features of the invention will be employed without a corresponding use of other features. Accordingly, it is appropriate that the appended claims be construed broadly and in a manner consistent with the spirit and scope of the invention herein.

What is claimed is:

1. Analog to digital converter means for generating a variable bit length digital output comprising:
   means for receiving an analog signal;
   adjustable means for selectively attenuating the signal level of the analog signal in said receiving means;
   signal converter means for converting the attenuated analog signal into an N-bit binary word representing said attenuated signal level;
   first storing means for storing the M most signficant bits of said binary word;
   decoder means responsive to selected bits of said binary word for adjusting said attenuating means to alter the attenuation of the analog signal in said receiving means as a function of the value of the selected bits stored in said first storing means;
   means for causing said first converter means to convert the analog signal level now presented by said adjustable means into an N-bit binary word;
   second storing means for receiving and storing said N-bit binary word from said signal converter means, whereby the contents of said first and second storing means are utilized to form a binary word representing the analog signal in said receiving means and the bit length of the binary word is inversely proportional to the magnitude of the analog signal.

2. Analog to digital converter means for generating a variable bit length digital output comprising:
   means for receiving an analog signal;
   adjustable means for selectively attentuating the signal level of the analog signal in said receiving means;
   signal converter means for converting the attentuated analog signal into an N-bit binary word representing said attentuated signal level;
   first storing means for storing the M most significant bits of said binary word;
   decoder means responsive to selected bits of said binary word for adjusting said attentuating means to alter the attentuation of the analog signal in said receiving means as a function of the value of the selected bits stored in said first storing means;
   means for causing said first converter means to convert the analog signal level now presented by said adjustable means into an N-bit binary word;
   second storing means for receiving and storing said N-bit binary word from said signal converter means, whereby the contents of said first and second storing means are utilized to form a binary word representing the analog signal in said receiving means;
   an output line;
   means for shifting the contents of said first storing means to said output line in serial fashion;
   means for transferring the contents of said second storing means to said first storing means in serial fashion.

3. The converter of claim 2 further comprising means responsive to selected bits stored in said first register for transferring only selected bits of the data in said first register to said second register.

4. The converter of claim 2 further comprising means responsive to selected bits stored in said first register for altering selected bits of said data in said first register transferred to said second register.

5. The converter of claim 2 further comprising means responsive to selected bits stored in said first register means for omitting selected ones of the bits stored in said second register means from being transferred to said output line.

6. A method for converting an analog signal, whose magnitude lies within a predetermined range, into a variable length digital signal comprising the steps of:
   temporarily storing said analog signal;
   attentuating said analog signal a predetermined amount so that its magnitude is reduced to a value near the low end of said range;
   converting the attentuated signal into a multi-bit binary word representing the magnitude of said attentuated signal;
   storing a portion of said multi-bit binary word;
   examining said stored portion and altering the amount of attenuation of said stored analog signal in accordance with the value of the stored portion of the multi-bit binary word;
   converting the analog signal whose magnitude has been so altered into a second multi-bit binary word;
   combining one or more of said bits initially stored with said second multi-bit binary word to form a multi-bit binary word whose resolution (i.e. word length) is a function of the magnitude of the stored analog signal wherein the smaller the magnitude of the stored analog signal, the greater the resolution, (i.e. length) of its multi-bit binary word.

7. The method of claim 6 further comprising adding additional binary bits to the multi-bit binary word to form multi-bit binary words of uniform word length wherein said uniform word length is greater than the length of the second multi-bit binary word; and
   transmitting the bits of the words of uniform word length in serial fashion to a utilization device for subsequent processing.

* * * * *